US012676119B2

(12) United States Patent
He et al.

(10) Patent No.: US 12,676,119 B2
(45) Date of Patent: Jul. 7, 2026

(54) DISPLAY SUBSTRATE HAVING COMPENSATION SCANNING MEMBER ARRANGED IN THE NOTCH AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Fan He, Beijing (CN); Qiwei Wang, Beijing (CN); Jun Yan, Beijing (CN); Kemeng Tong, Beijing (CN); Wenzhe Cai, Beijing (CN); Xiangdan Dong, Beijing (CN)

(73) Assignees: CHENGDU BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/857,242

(22) PCT Filed: Nov. 9, 2023

(86) PCT No.: PCT/CN2023/130648
§ 371 (c)(1),
(2) Date: Oct. 16, 2024

(87) PCT Pub. No.: WO2024/139772
PCT Pub. Date: Jul. 4, 2024

(65) Prior Publication Data
US 2025/0285597 A1 Sep. 11, 2025

(30) Foreign Application Priority Data
Dec. 26, 2022 (CN) .......................... 202211675576.9

(51) Int. Cl.
*G09G 3/3266* (2016.01)
*G09G 3/3258* (2016.01)
*H10K 59/131* (2023.01)

(52) U.S. Cl.
CPC ......... *G09G 3/3266* (2013.01); *G09G 3/3258* (2013.01); *H10K 59/131* (2023.02);
(Continued)

(58) Field of Classification Search
CPC ... G09G 3/30–3291; G09G 2300/0408; G09G 2300/0421–043; G09G 2300/0819;
(Continued)

(56) References Cited

U.S. PATENT DOCUMENTS

| | | | | |
|---|---|---|---|---|
| 10,559,253 B1 * | 2/2020 | Li | ......................... | H10K 59/131 |
| 10,559,597 B1 * | 2/2020 | Li | ......................... | H10D 86/481 |
| | (Continued) | | | |

FOREIGN PATENT DOCUMENTS

| | | | |
|---|---|---|---|
| CN | 108598139 A | 9/2018 | |
| CN | 108803178 A | 11/2018 | |
| CN | 209843713 U | 12/2019 | |
| CN | 113169216 B * | 7/2022 | ............. H10K 59/65 |
| CN | 116110909 A | 5/2023 | |
| CN | 116206559 A | 6/2023 | |

*Primary Examiner* — Keith L Crawley
(74) *Attorney, Agent, or Firm* — WHDA, LLP

(57) ABSTRACT

The present disclosure provides a display substrate and a display device. A display region of the display substrate includes a first display region and a second display region arranged opposite to each other, a peripheral region includes a notch arranged between the first display region and the second display region. A scanning line in the display substrate includes a first scanning member, a second scanning member and a compensation scanning member, the first scanning member is arranged in the first display region, the second scanning member is arranged in the second display region, and at least a part of the compensation scanning member is arranged in the notch. The compensation scanning member is coupled to the first scanning member and the (Continued)

second scanning member. An orthogonal projection of the compensation scanning member onto the base substrate overlaps with an orthogonal projection of a peripheral power line onto the base substrate.

19 Claims, 8 Drawing Sheets

(52) U.S. Cl.
CPC .............. *G09G 2300/0408* (2013.01); *G09G 2300/0819* (2013.01); *G09G 2300/0842* (2013.01); *G09G 2300/0861* (2013.01); *G09G 2310/0283* (2013.01); *G09G 2320/0233* (2013.01); *G09G 2330/04* (2013.01)

(58) Field of Classification Search
CPC ... G09G 2300/0842; G09G 2300/0861; G09G 2310/0281–0283; G09G 2320/0223; G09G 2320/0233; G09G 2330/04; H10K 59/131–1315; H10K 59/80–805; H10K 59/82; H10K 59/873; G02F 1/136286–136295; H10D 89/60; H10D 89/921–931

See application file for complete search history.

(56)                    References Cited

U.S. PATENT DOCUMENTS

| | | | | |
|---|---|---|---|---|
| 10,573,236 | B1 * | 2/2020 | Gao | G09G 3/2044 |
| 2017/0301280 | A1 * | 10/2017 | Ka | G09G 3/3406 |
| 2019/0051718 | A1 * | 2/2019 | Zhang | G09G 3/3225 |
| 2019/0181213 | A1 * | 6/2019 | Lim | G09G 3/3225 |
| 2019/0304366 | A1 * | 10/2019 | Ka | H10K 59/1213 |
| 2019/0312096 | A1 * | 10/2019 | Na | H10K 50/8445 |
| 2019/0331974 | A1 * | 10/2019 | Furuta | G02F 1/136286 |
| 2019/0392767 | A1 * | 12/2019 | Kim | G09G 3/20 |
| 2020/0027943 | A1 * | 1/2020 | Kim | H10K 59/131 |
| 2021/0043621 | A1 * | 2/2021 | Long | H10D 89/711 |
| 2021/0217838 | A1 * | 7/2021 | Chen | H10K 59/131 |
| 2021/0376042 | A1 * | 12/2021 | Cho | H10K 59/40 |
| 2022/0069050 | A1 * | 3/2022 | Bang | H10K 59/121 |
| 2022/0115487 | A1 * | 4/2022 | Shu | H10K 59/131 |
| 2022/0199029 | A1 * | 6/2022 | Xiao | H10K 59/131 |
| 2022/0320236 | A1 * | 10/2022 | Dai | H10K 50/844 |
| 2022/0343843 | A1 * | 10/2022 | Du | G09G 3/3233 |
| 2022/0399422 | A1 * | 12/2022 | Zhang | H10K 59/65 |
| 2022/0415998 | A1 * | 12/2022 | Liu | G02B 27/01 |

* cited by examiner

20

DISPLAY SUBSTRATE HAVING COMPENSATION SCANNING MEMBER ARRANGED IN THE NOTCH AND DISPLAY DEVICE

CROSS-REFERENCE TO RELATED APPLICATION

This application is the U.S. national phase of PCT Application No. PCT/CN2023/130648 filed on Nov. 9, 2023, which claims a priority of the Chinese patent application No. 202211675576.9 filed on Dec. 26, 2022, which is incorporated herein by reference in its entirety.

TECHNICAL FIELD

The present disclosure relates to the field of display technology, in particular to a display substrate and a display device.

BACKGROUND

Along with the rapid development of Active-Matrix Organic Light-Emitting Diode (AMOLED) display technology, not only mobile products but also large-sized display products such as laptops and vehicle-mounted products are transformed from being rigid to flexible. Various large-sized display products are provided, e.g., a notch is provided above a display screen, and such elements as camera are mainly arranged in the notch. However, for the display product with the notch, no pixel is formed in the notch, so there is a difference in loading between signal lines at left and right sides of the notch and the other signal lines in a display region, and thereby the display quality is adversely affected.

SUMMARY

An object of the present disclosure is to provide a display substrate and a display device, so as to solve the above-mentioned problems.

In order to achieve the above-mentioned object, the present disclosure provides the following technical solutions.

In one aspect, the present disclosure provides in some embodiments a display substrate, including a base substrate, and a display region and a peripheral region arranged on the base substrate, the display region including a first display region and a second display region arranged opposite to the first display region, the peripheral region including a notch, and at least a part of the notch being arranged between the first display region and the second display region. The display substrate further includes: a scanning line including a first scanning member, a second scanning member and a compensation scanning member, the first scanning member being arranged in the first display region, the second scanning member being arranged in the second display region, at least a part of the compensation scanning member being arranged in the notch, the compensation scanning member being coupled to the first scanning member and the second scanning member; and a peripheral power line arranged in the peripheral region. An orthogonal projection of the compensation scanning member onto the base substrate at least partially overlaps with an orthogonal projection of the peripheral power line onto the base substrate.

In a possible embodiment of the present disclosure, the display region includes a plurality of sub-pixels, each sub-pixel includes a sub-pixel driving circuitry and a light-emitting element coupled to each other, the sub-pixel driving circuitry includes a driving transistor and a compensation transistor, a first electrode of the compensation transistor is coupled to a second electrode of the driving transistor, and a second electrode of the compensation transistor is coupled to a gate electrode of the driving transistor; and the scanning line includes a gate line coupled to a gate electrode of the compensation transistor in a corresponding sub-pixel driving circuitry.

In a possible embodiment of the present disclosure, the sub-pixel driving circuitry includes a resetting transistor, a first electrode of the resetting transistor is coupled to an initialization signal input end, and a second electrode of the resetting transistor is coupled to the gate electrode of the driving transistor; and the scanning line further includes a resetting signal line coupled to a gate electrode of the resetting transistor in a corresponding sub-pixel driving circuitry.

In a possible embodiment of the present disclosure, the sub-pixel driving circuitry further includes a light-emission control transistor, a first electrode of the light-emission control transistor is coupled to the second electrode of the driving transistor, and a second electrode of the light-emission control transistor is coupled to a corresponding light-emitting element; and the scanning line further includes a light-emission control signal line coupled to a gate electrode of the light-emission control transistor in a corresponding sub-pixel driving circuitry.

In a possible embodiment of the present disclosure, the display substrate further includes a cathode layer coupled to the peripheral power line.

In a possible embodiment of the present disclosure, the compensation scanning member is arranged at a same layer as the first scanning member and the second scanning member, or at a layer different from the first scanning member and the second scanning member.

In a possible embodiment of the present disclosure, the compensation scanning member is coupled to the first scanning member and the second scanning member through a conductive connection member; the display substrate further includes an electrostatic discharge circuitry, and at least a part of the electrostatic discharge circuitry is arranged in the notch; and the electrostatic discharge circuitry includes a high-level signal line and a low-level signal line, and an orthogonal projection of the conductive connection member onto the base substrate at least partially overlaps with an orthogonal projection of the high-level signal line onto the base substrate and an orthogonal projection of the low-level signal line onto the base substrate.

In a possible embodiment of the present disclosure, the display substrate further includes a first partial gate driving circuitry and a second partial gate driving circuitry arranged in the peripheral region, and the notch is arranged between the first partial gate driving circuitry and the second partial gate driving circuitry; and the display substrate further includes a gate driving signal line, the gate driving signal line includes a first gate driving member, a second gate driving member and a compensation driving member, the first gate driving member is coupled to the first partial gate driving circuitry, the second gate driving member is coupled to the second partial gate driving circuitry, and the compensation driving member is coupled to the first gate driving member and the second gate driving member.

In a possible embodiment of the present disclosure, at least a part of the compensation driving member is arranged in the notch, and an orthogonal projection of the compensation driving member onto the base substrate at least partially overlaps with the orthogonal projection of the peripheral power line onto the base substrate.

In a possible embodiment of the present disclosure, the orthogonal projection of the compensation scanning member onto the base substrate is arranged between the display region and the orthogonal projection of the compensation driving member onto the base substrate.

In a possible embodiment of the present disclosure, the display substrate further includes an electrostatic discharge circuitry arranged in the peripheral region, at least a part of the compensation driving member is arranged in the notch, and an orthogonal projection of the compensation driving member onto the base substrate at least partially overlaps with an orthogonal projection of the electrostatic discharge circuitry onto the base substrate.

In a possible embodiment of the present disclosure, the gate driving signal line includes a positive phase clock signal line and a negative phase clock signal line.

In a possible embodiment of the present disclosure, an orthogonal projection of a compensation driving member of the negative phase clock signal line onto the base substrate is arranged between the display region and an orthogonal projection of a compensation driving member of the positive phase clock signal line onto the base substrate.

In a possible embodiment of the present disclosure, the compensation driving member is arranged at a same layer as the compensation scanning member; or the compensation driving member is arranged at a layer different from the compensation scanning member.

In a possible embodiment of the present disclosure, the display substrate further includes an inorganic encapsulation layer; in the notch, an orthogonal projection of the inorganic encapsulation layer onto the base substrate is spaced apart from a boundary of the base substrate by a minimum first distance; in a region other than the notch in the peripheral region, the orthogonal projection of the inorganic encapsulation layer onto the base substrate is spaced apart from the boundary of the base substrate by a minimum second distance; and the first distance is greater than the second distance.

In a possible embodiment of the present disclosure, the display substrate further includes a dam structure arranged in the peripheral region and at least partially surrounding the display region; in the notch, an orthogonal projection of the dam structure onto the base substrate is spaced apart from the boundary of the base substrate by a minimum third distance; in the region other than the notch in the peripheral region, the orthogonal projection of the dam structure onto the base substrate is spaced apart from the boundary of the base substrate by a minimum fourth distance; and the third distance is greater than the fourth distance.

In another aspect, the present disclosure provides in some embodiments a display device including the above-mentioned display substrate.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure. In these drawings.

DETAILED DESCRIPTION

Figure 1:
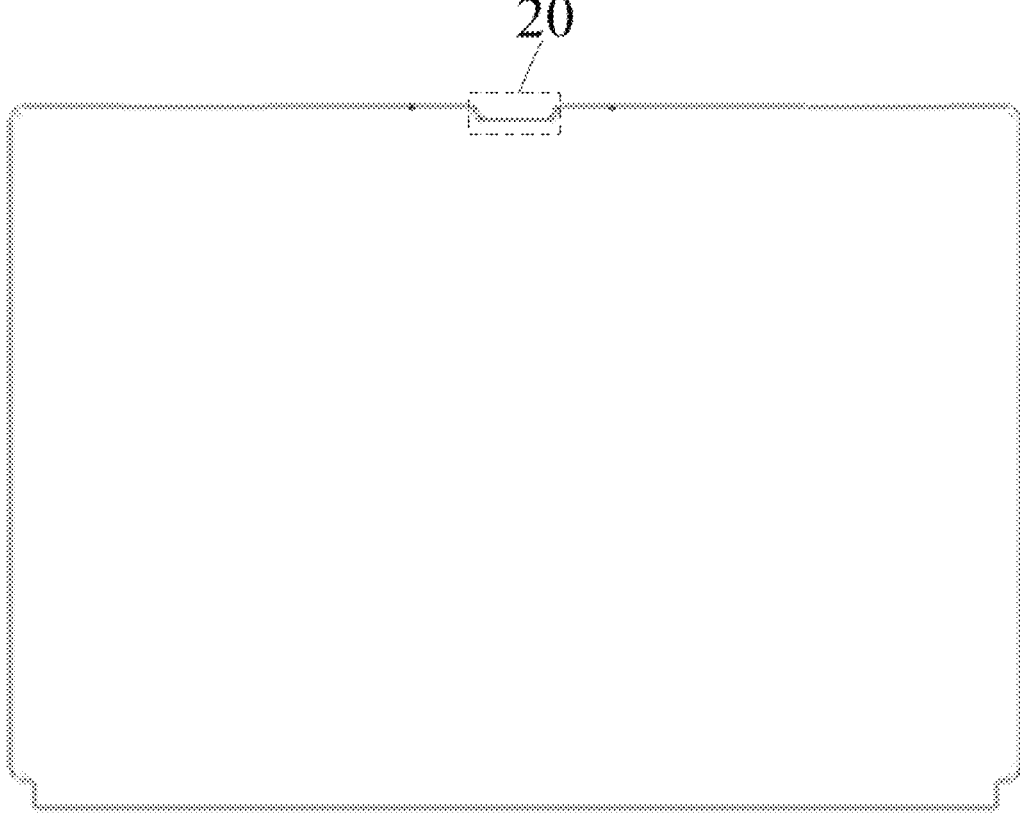
FIG. 1 is a schematic view showing a position of a notch in a display substrate according to one embodiment of the present disclosure.

The present disclosure will be described hereinafter in conjunction with the drawings and embodiments.

Referring to FIGS. 1, 7, 8, 9, and 12, the present disclosure provides in some embodiments a display substrate, which includes a base substrate, and a display region and a peripheral region 2 arranged on the base substrate. The display region includes a first display region 11 and a second display region 12 arranged opposite to each other. The peripheral region 2 includes a notch 20, and at least a part of the notch 20 is arranged between the first display region 11 and the second display region 12. The display substrate further includes: a scanning line including a first scanning member 301, a second scanning member (not shown in the drawings) and a compensation scanning member 302, the first scanning member 301 being arranged in the first display region 11, the second scanning member being arranged in the second display region 12, at least a part of the compensation scanning member 302 being arranged in the notch 20, the compensation scanning member 302 being coupled to the first scanning member 301 and the second scanning member; and a peripheral power line 40 arranged in the peripheral region 2. An orthogonal projection of the compensation scanning member 302 onto the base substrate at least partially overlaps with an orthogonal projection of the peripheral power line 40 onto the base substrate.

Illustratively, the display substrate includes the display region and the peripheral region 2 surrounding the display region.

The display region includes a plurality of sub-pixels 70, and a plurality of sub-pixel driving circuitries of the sub-pixels 70 is arranged in an array form, i.e., in rows and columns. The plurality of rows of sub-pixel driving circuitries is arranged along a second direction, and each row includes a plurality of sub-pixel driving circuitries arranged along a first direction. The plurality of columns of sub-pixel driving circuitries is arranged along the first direction, and each column includes a plurality of sub-pixel driving circuitries arranged along the second direction. Illustratively, the first direction intersects the second direction. For example, the first direction includes a transverse direction, and the second direction includes a longitudinal direction.

Illustratively, the sub-pixel includes a sub-pixel driving circuitry and a light-emitting element. The sub-pixel driving circuitry is coupled to an anode of the light-emitting element, and configured to apply a driving signal to the light-emitting element so as to drive the light-emitting element to emit light.

Illustratively, the display region includes the first display region 11, the second display region 12 and a third display region 13. The first display region 11 and the second display region 12 are arranged opposite to each other along the first direction, and the third display region 13 is arranged at a first side of the first display region 11 and the second display region 12. In a possible embodiment of the present disclosure, the first side is, but not limited to, a side facing a lower bezel of the display substrate.

Illustratively, a width of the first display region 11 and a width of the second display region 12 are smaller than a width of the third display region 13 along the first direction. Illustratively, the width of the first display region 11 is equal to the width of the second display region 12 along the first direction.

Illustratively, the peripheral region 2 includes the notch 20. The notch 20 is arranged between the first display region 11 and the second display region 12, and the third display region 13 is arranged at a first side of the notch 20.

Illustratively, the first scanning member 301 is arranged at a same layer as the second scanning member. The compensation scanning member 302 is arranged at a same layer as, or at a layer different from, the first scanning member 301.

Illustratively, the compensation scanning member 302 is directly electrically coupled to the first scanning member 301; or the compensation scanning member 302 is electrically coupled to the first scanning member 301 through a conductive connection member 50.

Illustratively, the compensation scanning member 302 is directly electrically coupled to the second scanning member; or the compensation scanning member 302 is electrically coupled to the second scanning member through a conductive connection member 50.

Illustratively, the first scanning member 301 includes at least a part extending along the first direction, the second scanning member includes at least a part extending along the first direction, and the compensation scanning member 302 extends along an extension direction of a boundary of the display substrate at the notch 20.

Illustratively, the first scanning member 301 is coupled to a corresponding row of sub-pixels in the first display region 11, and the second scanning member is coupled to a corresponding row of sub-pixels in the second display region 12. Illustratively, the row of sub-pixels coupled to the first scanning member 301 is located in a same row as the row of sub-pixels coupled to the second scanning member. The scanning member is configured to apply a corresponding scanning signal to the sub-pixels coupled thereto.

Illustratively, the peripheral power line 40 includes a part located in the notch 20, and a part located in a region other than the notch 20 in the peripheral region 2. Illustratively, the peripheral power line 40 is configured to provide a positive power signal or a negative power signal.

Based on the specific structure of the display substrate, the compensation scanning member 302 is arranged in the notch 20, and the first scanning member 301 in the first display region 11 is coupled to the second scanning member in the second display region 12 through the compensation scanning member 302 so that the loading of the scanning line including the compensation scanning member 302, the first scanning member 301 and the second scanning member is consistent with the loading of the scanning line in the third display region 13, i.e., the loading of the scanning line in the first display region 11 and the second display region 12 is consistent with the loading of the scanning line in the third display region 13. Hence, in the presence of the notch 20, it is able to ensure the loading uniformity of the scanning lines for transmitting the same signal in the display region, thereby to ensure the display quality of the display substrate.

Furthermore, the orthogonal projection of the compensation scanning member 302 onto the base substrate at least partially overlaps with the orthogonal projection of the peripheral power line 40 onto the base substrate, so the compensation scanning member 302 does not occupy any additional space in the peripheral region 2. As a result, it is able to prevent a width of a bezel of the display substrate from being increased due to the compensation scanning member 302, thereby to provide the display substrate with a narrow bezel.

Figure 14:
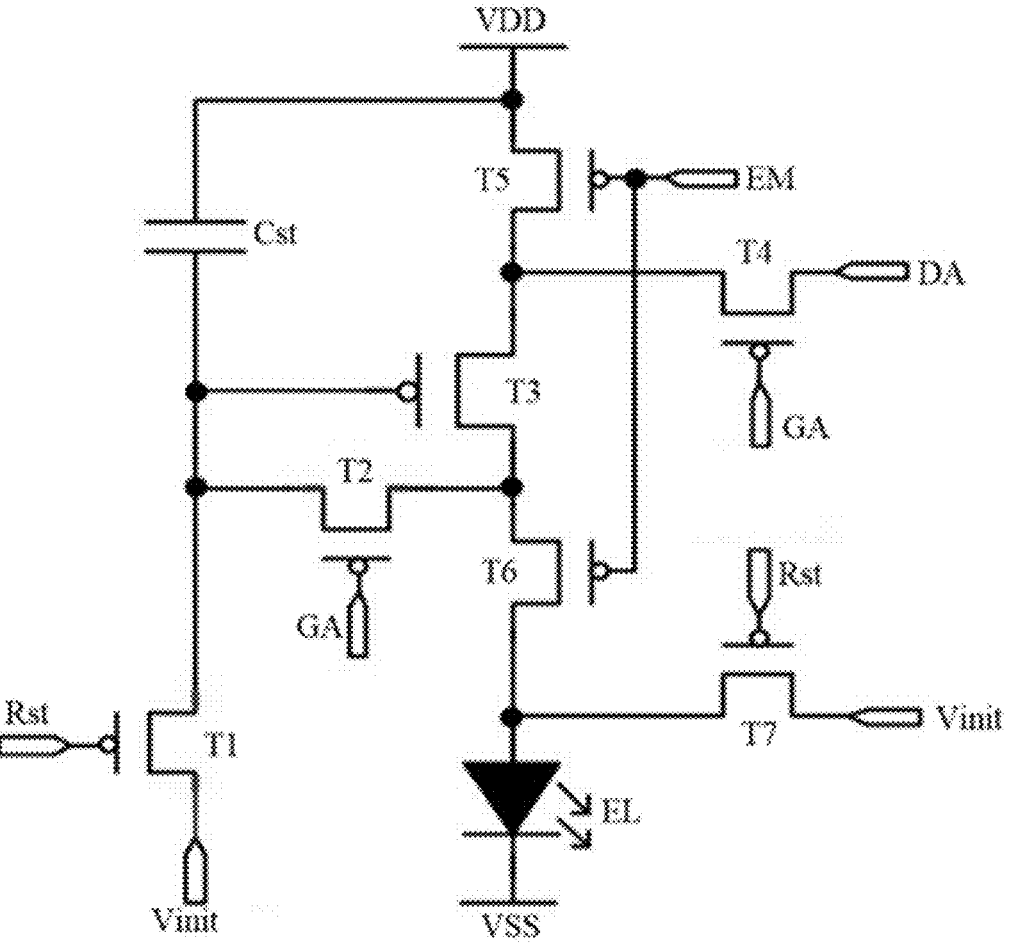
FIG. 14 is a circuit diagram of a pixel driving circuitry according to one embodiment of the present disclosure.

As shown in FIG. 14, there are various structures for the sub-pixel driving circuitry. Illustratively, the sub-pixel driving circuitry includes, but not limited to, a 7T1C structure (i.e., 7 transistors and 1 capacitor).

As shown in FIG. 14, taking the 7T1C structure as an example, the sub-pixel driving circuitry includes a driving transistor T3, a first resetting transistor T1, a compensation transistor T2, a data write-in transistor T4, a power control transistor T5, a light-emission control transistor T6, a second resetting transistor T7, and a storage capacitor Cst.

The display substrate further includes a plurality of resetting signal lines Rst, a plurality of initialization signal lines Vinit, a plurality of gate lines GA, a plurality of data lines DA, a plurality of light-emission control signal lines EM, and a plurality of positive power lines VDD.

A gate electrode of the first resetting transistor T1 is coupled to a corresponding resetting signal line Rst, a first electrode of the first resetting transistor T1 is coupled to a corresponding initialization signal line Vinit, and a second electrode of the first resetting transistor T1 is coupled to a gate electrode of the driving transistor T3.

A gate electrode of the compensation transistor T2 is coupled to a corresponding gate line GA, a first electrode of the compensation transistor T2 is coupled to a second electrode of the driving transistor T3, and a second electrode of the compensation transistor T2 is coupled to the gate electrode of the driving transistor T3.

A gate electrode of the data write-in transistor T4 is coupled to a corresponding gate line GA, a first electrode of the data write-in transistor T4 is coupled to a corresponding data line DA, and a second electrode of the data write-in transistor T4 is coupled to a first electrode of the driving transistor T3.

A gate electrode of the power control transistor T5 is coupled to a corresponding light-emission control signal line EM, a first electrode of the power control transistor T5 is coupled to a corresponding positive power line VDD, and a second electrode of the power control transistor T5 is coupled to the first electrode of the driving transistor T3.

A gate electrode of the light-emission control transistor T6 is coupled to a corresponding light-emission control signal line EM, a first electrode of the light-emission control transistor T6 is coupled to the second electrode of the driving transistor T3, and a second electrode of the light-emission control transistor T6 is coupled to an anode of a corresponding light-emitting element.

A gate electrode of the second resetting transistor T7 is coupled to a corresponding resetting signal line Rst, a first electrode of the second resetting transistor T7 is coupled to a corresponding initialization signal line Vinit, and a second electrode of the second resetting transistor T7 is coupled to an anode of a corresponding light-emitting element EL. A cathode of the light-emitting element EL is configured to receive a power signal VSS.

A first plate of the storage capacitor Cst is coupled to the gate electrode of the driving transistor T3, and a second plate of the storage capacitor Cst is coupled to the positive power line VDD.

Referring to FIGS. 1, 4 to 7, 8, 9, and 12, in some embodiments of the present disclosure, the display region includes a plurality of sub-pixels 70, each sub-pixel 70 includes a sub-pixel driving circuitry and a light-emitting element EL coupled to each other, and the sub-pixel driving circuitry includes the driving transistor T3 and the compensation transistor T2. The first electrode of the compensation transistor T2 is coupled to the second electrode of the driving transistor T3, and the second electrode of the compensation transistor T2 is coupled to the gate electrode of the driving transistor T3.

The scanning line includes a gate line GA coupled to the gate electrode of the compensation transistor T2 in a corresponding sub-pixel driving circuitry.

Illustratively, the gate line includes the first scanning member 301, the second scanning member, and the compensation scanning member 302. The first scanning member 301 is coupled to the gate electrodes of the compensation transistors in a corresponding row of sub-pixel driving circuitries in the first display region 11, and the second scanning member is coupled to the gate electrodes of the compensation transistors in a corresponding row of sub-pixel driving circuitries in the second display region 12.

In the embodiments of the present disclosure, the scanning line includes the gate line, so in the presence of the notch 20, it is able to ensure the loading uniformity of the gate lines in the display region, thereby to ensure the display quality of the display substrate.

Referring to FIGS. 1, 4 to 7, 8, 9, and 12, in some embodiments of the present disclosure, the sub-pixel driving circuitry includes a resetting transistor (T1 or T7). A first electrode of the resetting transistor is coupled to an initialization signal input end, and a second electrode of the resetting transistor is coupled to the gate electrode of the driving transistor T3.

The scanning line further includes a resetting signal line Rst coupled to a gate electrode of the resetting transistor in a corresponding sub-pixel driving circuitry.

Illustratively, the initialization signal input end includes an initialization signal line Vinit.

Illustratively, the resetting signal line includes the first scanning member 301, the second scanning member and the compensation scanning member 302. The first scanning member 301 is coupled to the gate electrodes of the resetting transistors in a corresponding row of sub-pixel driving circuitries in the first display region 11, and the second scanning member is coupled to the gate electrodes of the resetting transistors in a corresponding row of sub-pixel driving circuitries in the second display region 12.

In the embodiments of the present disclosure, the scanning line includes the resetting signal line, so in the presence of the notch 20, it is able to ensure the loading uniformity of the resetting signal lines in the display region, thereby to ensure the display quality of the display substrate.

Referring to FIGS. 1, 4 to 7, 8, 9 and 12, in some embodiments of the present disclosure, the sub-pixel driving circuitry further includes a light-emission control transistor T6. A first electrode of the light-emission control transistor T6 is coupled to the second electrode of the driving transistor T3, and a second electrode of the light-emission control transistor T6 is coupled to a corresponding light-emitting element EL.

The scanning line further includes a light-emission control signal line EM coupled to a gate electrode of the light-emission control transistor T6 in a corresponding sub-pixel driving circuitry.

Illustratively, the light-emission control signal line EM includes the first scanning member 301, the second scanning member and the compensation scanning member 302. The first scanning member 301 is coupled to the gate electrodes of the light-emission control transistors in a corresponding row of sub-pixel driving circuitries in the first display region 11, and the second scanning member is coupled to the gate electrodes of the light-emission control transistors in a corresponding row of sub-pixel driving circuitries in the second display region 12.

In the embodiments of the present disclosure, the scanning line includes the light-emission control signal line, so in the presence of the notch 20, it is able to ensure the loading uniformity of the light-emission control signal lines in the display region, thereby to ensure the display quality of the display substrate.

Figure 2:
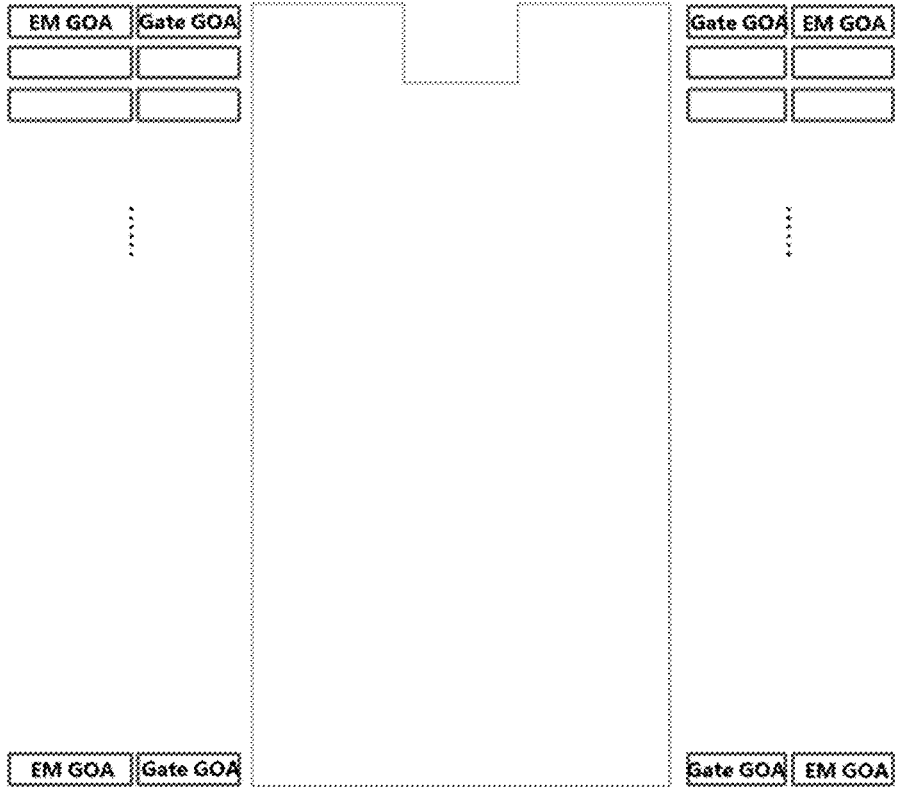
FIG. 2 is a schematic view showing a Gate On Array (GOA) of a small-sized display substrate according to one embodiment of the present disclosure.

It should be appreciated that, as shown in FIG. 2, for a display product with a screen having a small transverse width, there are usually two groups of gate driving circuitries (GOA), i.e., a group of Gate electrode GOAs and a group of EM GOAs. The Gate electrode GOA is configured to apply corresponding scanning signals to the first resetting transistor, the compensation transistor, the data write-in transistor and the second resetting transistor in the pixel driving circuitry, i.e., the gate lines and the resetting signal lines in the display substrate share one group of GOAs. The EM GOA is configured to apply corresponding scanning signals to the power control transistor and the light-emission control transistor in the pixel driving circuitry.

Figure 3:
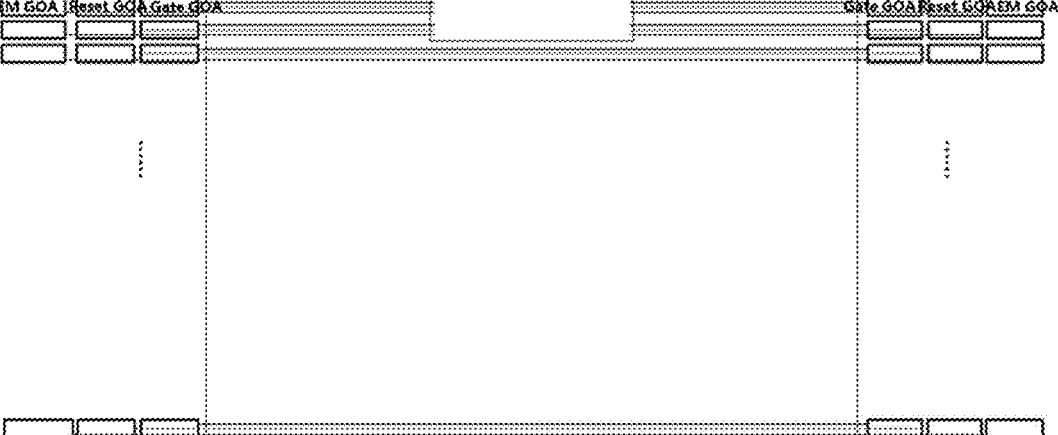
FIG. 3 is a schematic view showing a GOA of a large-sized display substrate according to one embodiment of the present disclosure.
Figure 4:
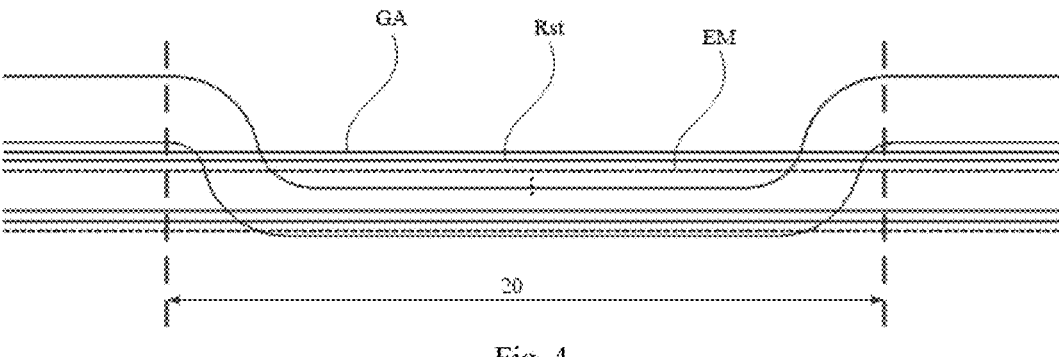
FIG. 4 is a schematic view showing the compensation of a scanning line according to one embodiment of the present disclosure.
Figure 5:
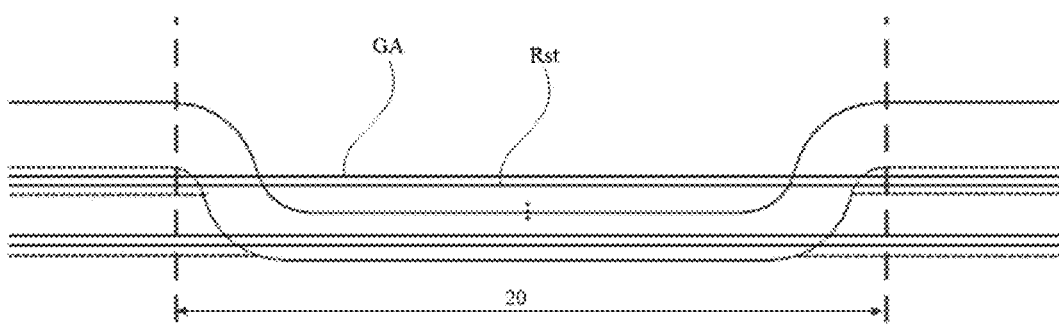
FIG. 5 is another schematic view showing the compensation of the scanning line according to one embodiment of the present disclosure.
Figure 6:
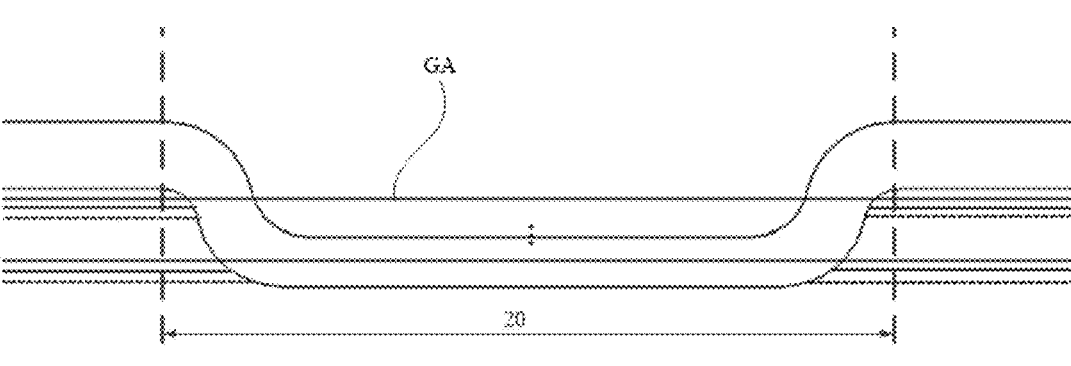
FIG. 6 is yet another schematic view showing the compensation of the scanning line according to one embodiment of the present disclosure.

As shown in FIG. 3, for a display product with a screen having a large transverse width, in order to ensure the driving force of the signal lines, generally two groups of GOAs are used for the gate lines and the resetting signal lines respectively, and there are three groups of GOAs in the display product, i.e., a group of Gate electrode GOAs, a group of Reset GOAs, and a group of EM GOAs.

In the case of a sufficient space for the bezel of the display product, the scanning lines may include the gate lines GA, the resetting signal lines Rst, and the light-emission control signal lines EM.

A difference in loading mainly affects a rise time (Tr) and a fall time (Tf) of a transmitted signal, a light-emission control signal transmitted through the light-emission control signal line is enabled for a very long time period within one frame, and a very little effect is caused by the change in Tr and Tf on the operation of the pixel driving circuitry. Hence, in the case of the limited space for the bezel of the display product, the scanning lines may be selected to include only the gate lines and the resetting signal lines.

A resetting signal transmitted through the resetting signal line mainly acts on the gate electrode of the first resetting transistor and the gate electrode of the second resetting transistor, the first resetting transistor is configured to reset the gate electrode of the driving transistor, and the second resetting transistor is configured to reset the anode of the light-emitting element. When Tr and Tf of the resetting signal change, resetting voltages on the gate electrode of the driving transistor and the anode of the light-emitting element are mainly affected, but these resetting voltages have less effect on the operation of the pixel driving circuitry. Hence, in the case that space for the bezel of the display product is further reduced, the scanning lines may be selected to include only the gate lines.

In some embodiments of the present disclosure, the display substrate further includes a cathode layer coupled to the peripheral power line 40.

Illustratively, the display substrate includes an active layer, a first gate insulation layer, a first gate metal layer, a second gate insulation layer, a second gate metal layer, an interlayer insulation layer, a first source/drain metal layer, a first planarization layer, a second source/drain metal layer, a second planarization layer, an anode layer, a light-emitting functional layer, a cathode layer, a first inorganic encapsulation layer, an organic encapsulation layer and a second inorganic encapsulation layer laminated one on another on the base substrate in a direction away from the base substrate. Illustratively, the display substrate further includes a passivation layer arranged between the first source/drain metal layer and the first planarization layer or between the second source/drain metal layer and the second planarization layer.

Illustratively, the peripheral power line 40 is coupled to the cathode layer, and configured to apply a corresponding power signal to the cathode layer.

Illustratively, the peripheral power line 40 is made of the first source/drain metal layer.

In the embodiments of the present disclosure, a stable power signal is transmitted through the peripheral power line 40. When the orthogonal projection of the compensation scanning member 302 onto the base substrate at least partially overlaps with the orthogonal projection of the peripheral power line 40 onto the base substrate, it is able to improve the stability of the signal transmitted through the scanning line.

In some embodiments of the present disclosure, the compensation scanning member 302 is arranged at a same layer as the first scanning member 301 and the second scanning member.

Illustratively, the compensation scanning member 302, the first scanning member 301, and the second scanning member are made of the second gate metal layer.

Illustratively, the compensation scanning member is arranged at a layer different from the first scanning member and at a layer different from the second scanning member, and the first scanning member is arranged at a same layer as the second scanning member.

Based on the above, it is able to form the compensation scanning member 302, the first scanning member 301, and the second scanning member through a single patterning process, thereby to simplify the manufacturing process of the display substrate and reduce the manufacturing cost.

Referring to FIGS. 1, 7, 8, 9, and 12, in some embodiments of the present disclosure, the compensation scanning member 302 is coupled to the first scanning member 301 and the second scanning member through a conductive connection member 50.

The display substrate further includes an electrostatic discharge circuitry ESD, and at least a part of the electrostatic discharge circuitry ESD is located in the notch 20. The electrostatic discharge circuitry ESD includes a high-level signal line and a low-level signal line (80 in FIG. 9), and an orthogonal projection of the conductive connection member 50 onto the base substrate at least partially overlaps with an orthogonal projection of the high-level signal line onto the base substrate and an orthogonal projection of the low-level signal line onto the base substrate.

Illustratively, the conductive connection member 50 is made of the first source/drain metal layer. The compensation scanning member 302 is coupled to the first scanning member 301 through a corresponding conductive connection member 50, and the compensation scanning member 302 is coupled to the second scanning member through a corresponding conductive connection member 50.

Illustratively, at least a part of an orthogonal projection of the electrostatic discharge circuitry ESD onto the base substrate is arranged between the orthogonal projection of the compensation scanning member 302 onto the base substrate and the display region. The conductive connection member 50 is electrically coupled to the compensation scanning member 302 and the first scanning member 301 (or the second scanning member) through the electrostatic discharge circuitry ESD.

Illustratively, the high-level signal line includes a VGH signal line, and the low-level signal line includes a VGL signal line. The high-level signal line and the low-level signal line are both made of the first gate metal layer.

Figure 15:
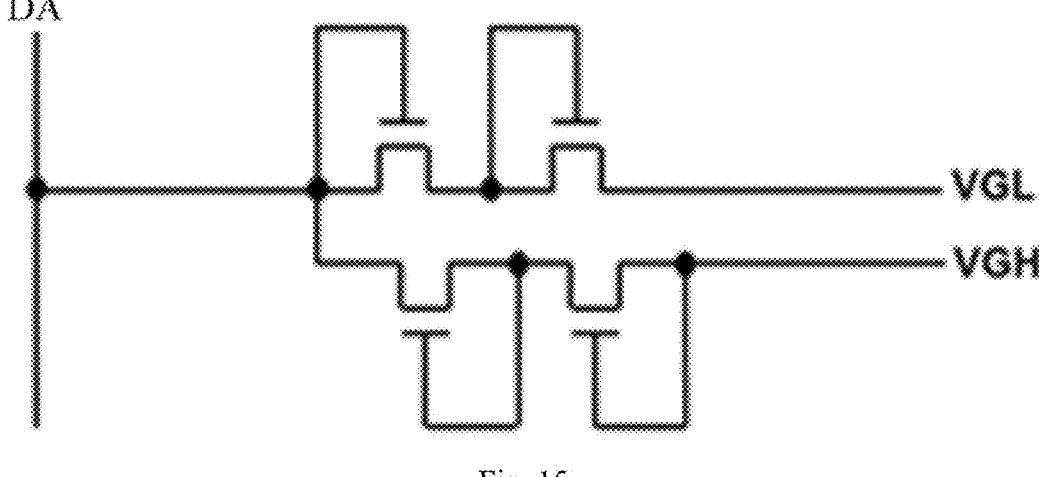
FIG. 15 is a circuit diagram of an electrostatic discharge circuitry according to one embodiment of the present disclosure.

As shown in FIG. 15, illustratively, VGH is 7 V, and VGL is −7 V. When positive static charges are accumulated on the data line DA and reach the electrostatic discharge circuitry ESD (e.g., +100 V), the thin film transistors corresponding to the VGH signal line are turned on, and the positive charges are discharged through the circuitry corresponding to the VGH signal line. When negative static charges are accumulated on the data line DA and reach the electrostatic discharge circuitry ESD (e.g., −100 V), the thin film transistors corresponding to the VGL signal line are turned on, and the negative charges are discharged through the circuitry corresponding to the VGL signal line.

Based on the above, it is able to make full use of the space of the display substrate while ensuring the connection performance between the compensation scanning member 302 and the first scanning member 301 as well as the second scanning member, thereby to provide the display substrate with a narrow bezel.

As shown in FIGS. 9 to 12, in some embodiments of the present disclosure, the display substrate further includes a first partial gate driving circuitry GOA1 and a second partial gate driving circuitry GOA2 arranged in the peripheral region 2, and the notch 20 is arranged between the first partial gate driving circuitry GOAL and the second partial gate driving circuitry GOA2.

The display substrate further includes a gate driving signal line GOA-L. The gate driving signal line GOA-L includes a first gate driving member GOA-L1, a second gate driving member GOA-L2, and a compensation driving member GOA-L3. The first gate driving member GOA-L1 is coupled to the first partial gate driving circuitry GOA1, the second gate driving member GOA-L2 is coupled to the second partial gate driving circuitry GOA2, and the compensation driving member GOA-L3 is coupled to the first gate driving member GOA-L1 and the second gate driving member GOA-L2.

Illustratively, the first partial gate driving circuitry GOA1 is located at a left bezel of the display substrate, the second partial gate driving circuitry GOA2 is located at a right bezel of the display substrate, and the notch 20 is arranged between the first partial gate driving circuitry GOAL and the second partial gate driving circuitry GOA2.

Illustratively, the first gate driving member GOA-L1 is arranged at a same layer as the second gate driving member GOA-L2, and the compensation driving member GOA-L3 is arranged at a same layer as, or at a layer different from, the first gate driving member GOA-L1.

Illustratively, the first gate driving member GOA-L1 includes at least a part extending along the first direction, the second gate driving member GOA-L2 includes at least a part extending along the first direction, and the compensation driving member GOA-L3 extends along an extension direction of a boundary of the display substrate at the notch 20.

In the embodiments of the present disclosure, the first gate driving member GOA-L1 is electrically coupled to the second gate driving member GOA-L2 through the compensation driving member GOA-L3, so it is able to prevent the occurrence of a signal difference between the first partial gate driving circuitry GOA1 and the second partial gate driving circuitry GOA2.

Figure 9:
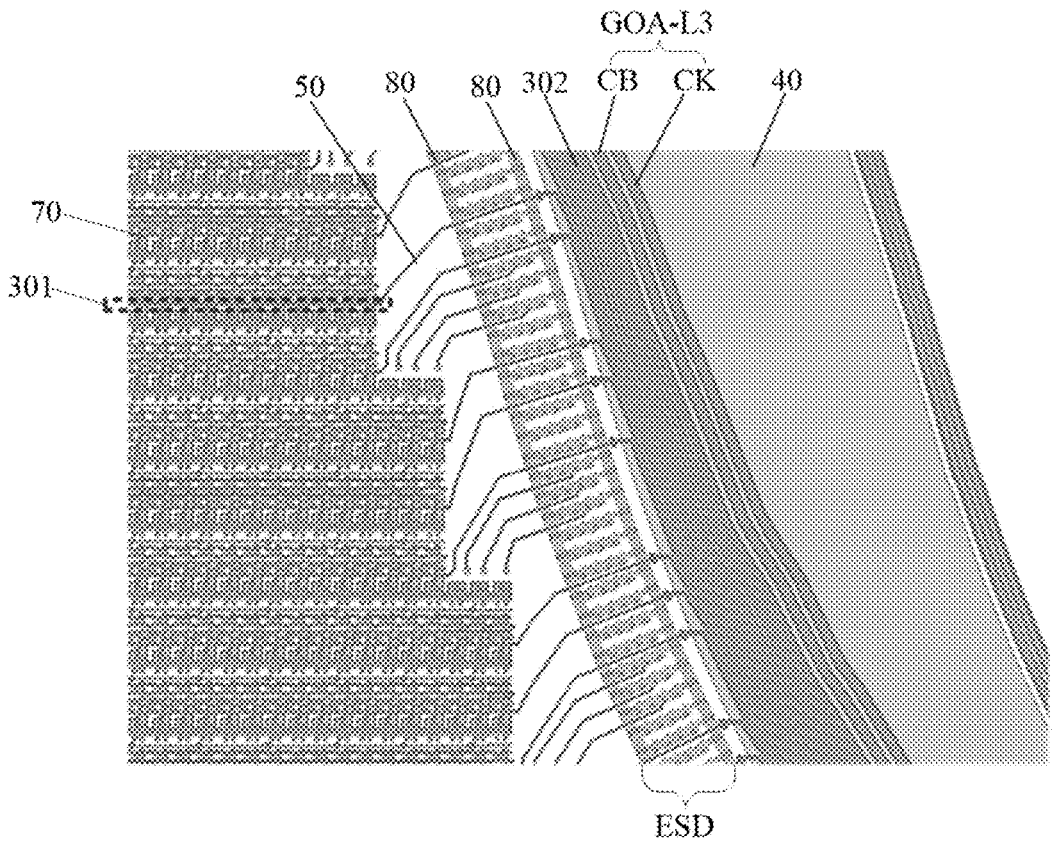
FIG. 9 is an enlarged view of Y1 in FIG. 8.
Figure 10:
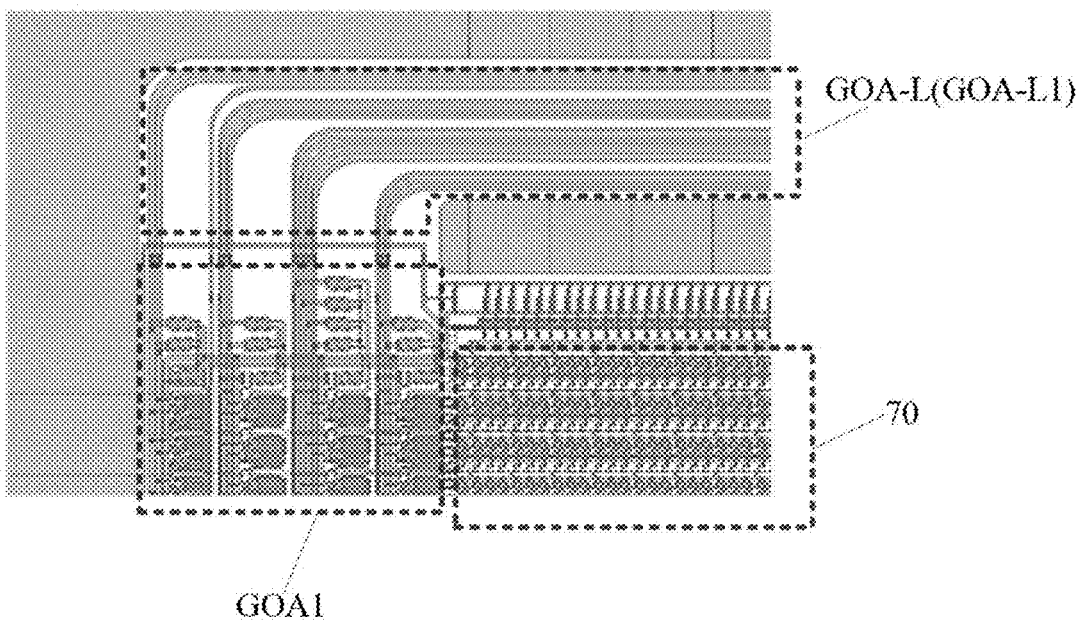
FIG. 10 is a schematic view showing an upper left corner of the display substrate according to one embodiment of the present disclosure.
Figure 11:
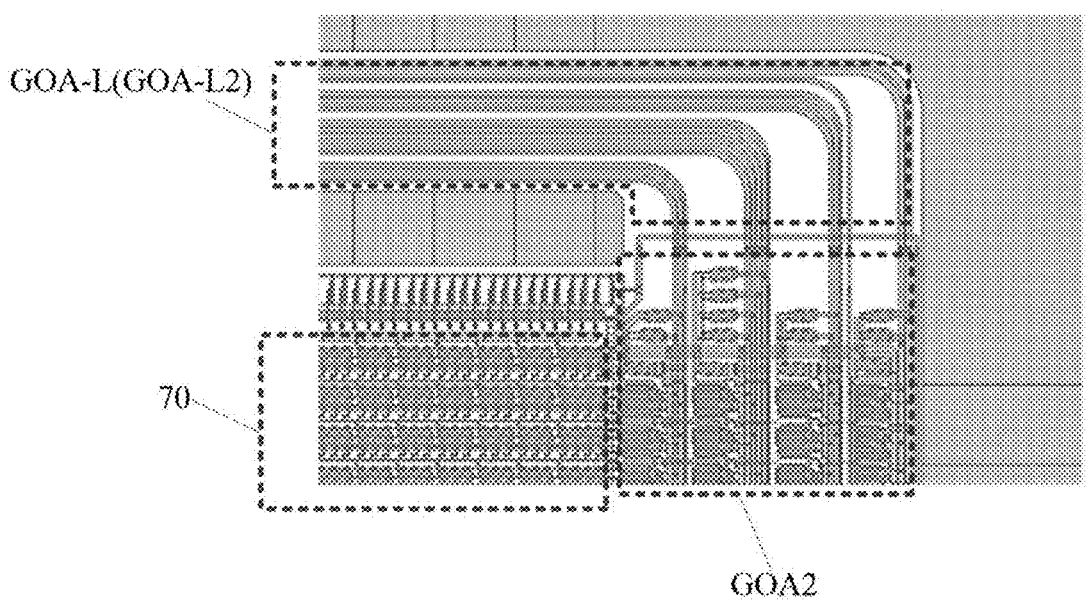
FIG. 11 is a schematic view showing an upper right corner of the display substrate according to one embodiment of the present disclosure.
Figure 12:
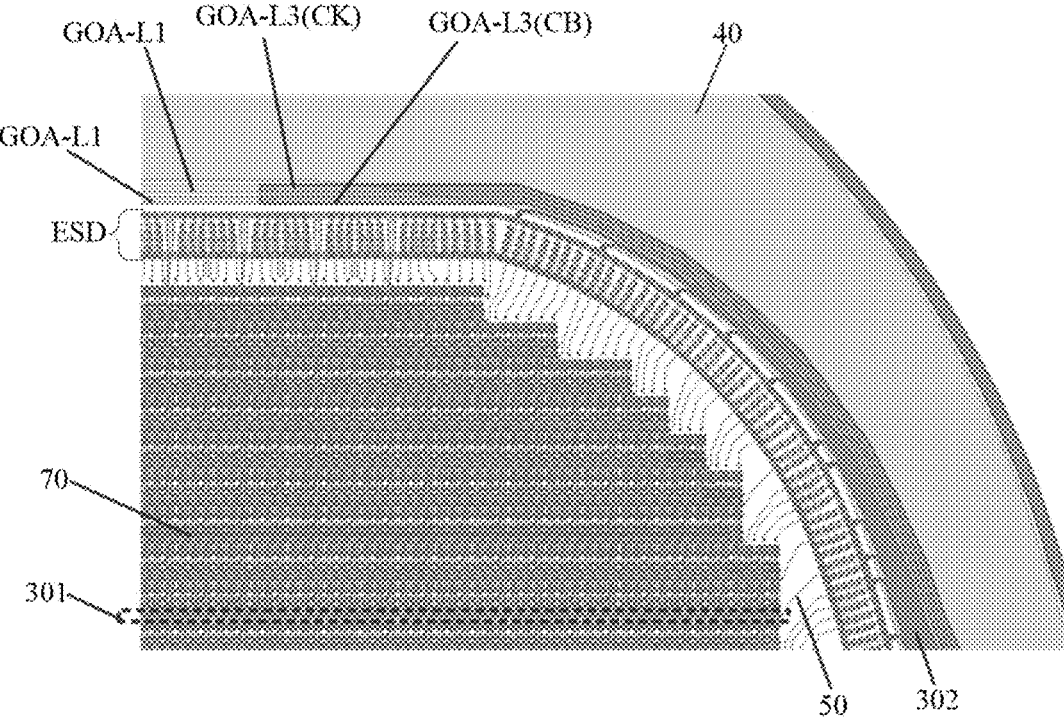
FIG. 12 is an enlarged view of Y2 in FIG. 9.

As shown in FIGS. 9 and 12, in some embodiments of the present disclosure, at least a part of the compensation driving member GOA-L3 is arranged in the notch 20, and an orthogonal projection of the compensation driving member GOA-L3 onto the base substrate at least partially overlaps with the orthogonal projection of the peripheral power line 40 onto the base substrate.

In the embodiments of the present disclosure, in the presence of the notch 20, it is able to prevent the occurrence of the signal difference between the first partial gate driving circuitry GOAL and the second partial gate driving circuitry GOA2, thereby to ensure the display quality of the display substrate.

Furthermore, in the embodiments of the present disclosure, when the orthogonal projection of the compensation driving member GOA-L3 onto the base substrate at least partially overlaps with the orthogonal projection of the peripheral power line 40 onto the base substrate, the compensation driving member GOA-L3 does not occupy any additional space in the peripheral region 2, so it is able to prevent the width of the bezel of the display substrate from being increased due to the compensation driving member GOA-L3, thereby to provide the display substrate with a narrow bezel.

As shown in FIG. 12, in some embodiments of the present disclosure, the orthogonal projection of the compensation scanning member 302 on the base substrate is arranged between the display region and the orthogonal projection of the compensation driving member GOA-L3 onto the base substrate.

Based on the above, the compensation driving member GOA-L3 is arranged at a side of the compensation scanning member 302 away from the display region, so it is able to prevent the compensation driving member GOA-L3 from overlapping with the compensation scanning member 302, thereby to prevent the occurrence of any interference between a signal transmitted through the compensation driving member GOA-L3 and a signal transmitted through the compensation scanning member 302, and ensure the stability of signal transmission.

In some embodiments of the present disclosure, the display substrate further includes an electrostatic discharge circuitry ESD arranged in the peripheral region 2.

At least a part of the compensation driving member GOA-L3 is arranged in the notch 20, and the orthogonal projection of the compensation driving member GOA-L3 onto the base substrate at least partially overlaps with an orthogonal projection of the electrostatic discharge circuitry ESD onto the base substrate.

Illustratively, the electrostatic discharge circuitry ESD is coupled to a data line in the display substrate and configured to discharge static electricity generated in the data line.

Illustratively, the orthogonal projection of the electrostatic discharge circuitry ESD onto the base substrate is arranged between the orthogonal projection of the peripheral power line 40 onto the base substrate and the display region.

In the embodiments of the present disclosure, when the orthogonal projection of the compensation driving member GOA-L3 onto the base substrate at least partially overlaps with the orthogonal projection of the electrostatic discharge circuitry ESD onto the base substrate, the compensation driving member GOA-L3 does not occupy any additional space in the peripheral region 2, so it is able to prevent the width of the bezel of the display substrate from being increased due to the compensation driving member GOA-L3, thereby to provide the display substrate with a narrow bezel.

As shown in FIG. 12, in some embodiments of the present disclosure, the gate driving signal line GOA-L includes a positive phase clock signal line CK and a negative phase clock signal line CB.

Illustratively, the positive phase clock signal line CK is has a phase inverse to the negative phase clock signal line CB.

Illustratively, the gate driving signal line GOA-L further includes a frame start signal line.

In some embodiments of the present disclosure, an orthogonal projection of a compensation driving member GOA-L3 of the negative phase clock signal line CB onto the base substrate is arranged between the display region and an orthogonal projection of a compensation driving member GOA-L3 of the positive phase clock signal line CK onto the base substrate.

Based on the above, the compensation scanning member 302, the compensation driving member GOA-L3 of the negative phase clock signal line CB, and the compensation driving member GOA-L3 of the positive phase clock signal line CK are arranged sequentially in a direction away from the display region, and overlap with the peripheral power line 40 in a direction perpendicular to the base substrate. In this way, it is able to make full use of the space, and provide the display substrate with a narrow bezel.

In some embodiments of the present disclosure, the compensation driving member GOA-L3 is arranged at a same layer as the compensation scanning member 302; or the compensation driving member GOA-L3 is arranged at a layer different from the compensation scanning member 302.

Illustratively, the first gate driving member GOA-L1 and the second gate driving member GOA-L2 are made of the first source/drain metal layer.

Illustratively, the compensation driving member GOA-L3 is made of the second gate metal layer.

In the embodiments of the present disclosure, when the compensation driving member GOA-L3 is arranged at a same layer as the compensation scanning member 302, the compensation driving member GOA-L3 and the compensation scanning member 302 may be formed through a single patterning process. In this way, it is able to simplify the manufacture process of the display substrate, and reduce the manufacture cost thereof.

Due to a hollowed-out design at the notch 20 of the display substrate, when an inorganic encapsulation layer is formed through a mask, a part of the mask corresponding to the notch 20 may be upturned, so a shadow of the inorganic encapsulation layer formed at the notch 20 is too large, i.e., a boundary of the inorganic encapsulation layer in the notch 20 is closer to a boundary of the display substrate. At this time, there is a thick inorganic film layer on a cutting line of a display module, and thereby cracks may occur during the cutting.

Figure 13:
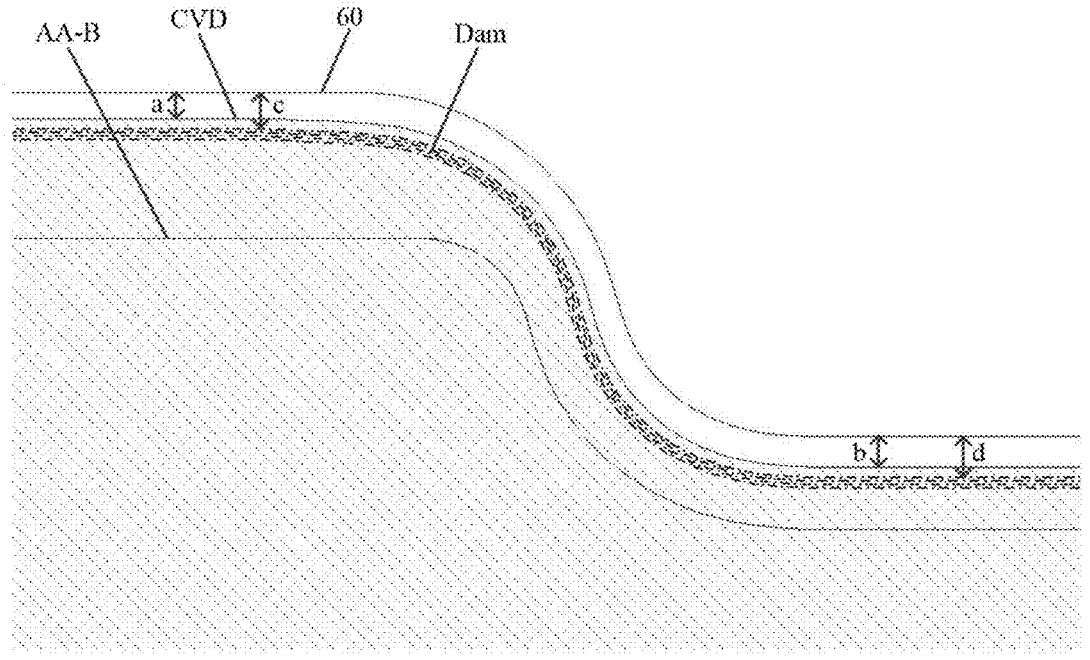
FIG. 13 is a schematic view showing distances between orthogonal projections of an inorganic encapsulation layer and a dam structure onto a base substrate and a boundary of the base substrate near the notch according to one embodiment of the present disclosure.

As shown in FIG. 13, in some embodiments of the present disclosure, the display substrate further includes an inorganic encapsulation layer. In the notch 20, an orthogonal projection of the inorganic encapsulation layer CVD onto the base substrate is spaced apart from a boundary 60 of the base substrate by a minimum first distance b. In a region 21 other than the notch 20 in the peripheral region 2, the orthogonal projection of the inorganic encapsulation layer CVD onto the base substrate is spaced apart from the boundary 60 of the base substrate by a minimum second distance a. The first distance b is greater than the second distance a.

It should be appreciated that, FIG. 13 also shows a boundary AA-B of the display region.

Figure 7:
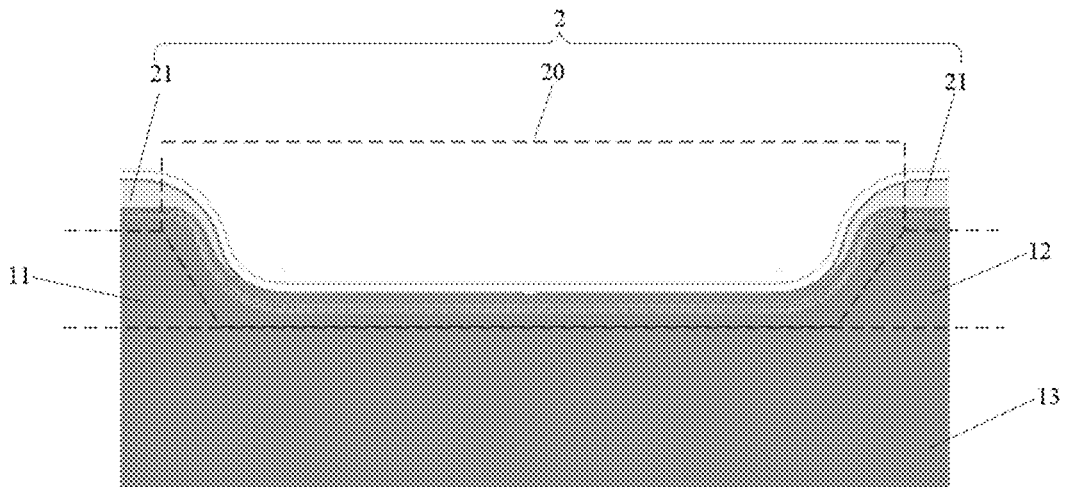
FIG. 7 is a schematic view showing a notch in the display substrate according to one embodiment of the present disclosure.
Figure 8:
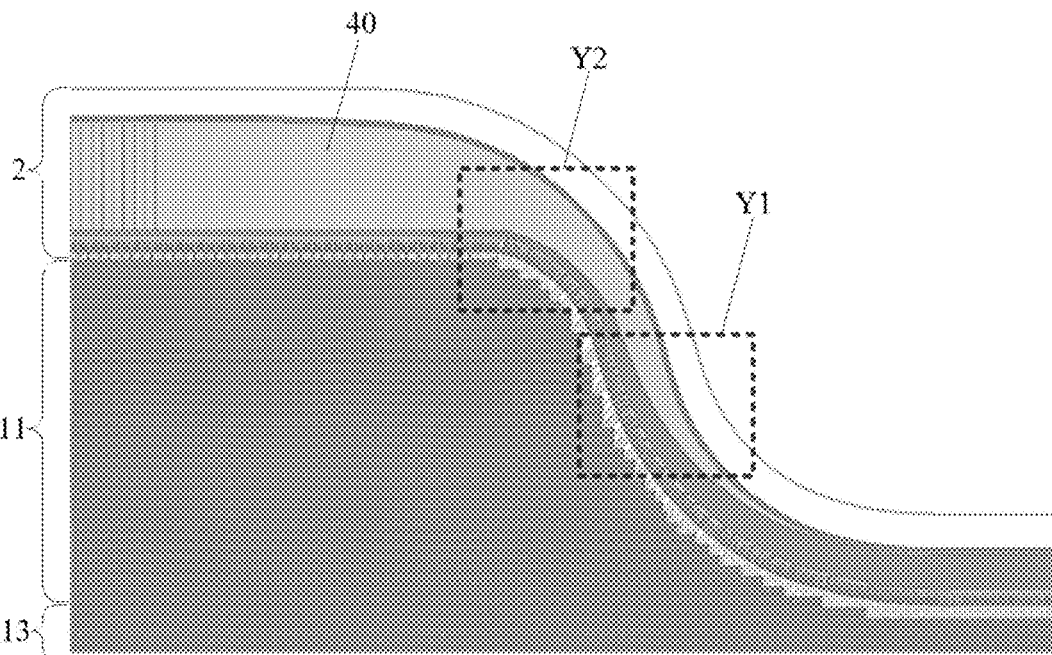
FIG. 8 is a schematic view showing a left side of the notch according to one embodiment of the present disclosure.

As shown in FIG. 7, illustratively, the region 21 other than the notch 20 in the peripheral region 2 includes a straight-edge region in which the orthogonal projection of the inorganic encapsulation layer onto the base substrate is spaced apart from the boundary of the base substrate by the minimum second distance.

In the embodiments of the present disclosure, when the first distance is greater than the second distance, there is a large distance between the boundary of the inorganic encapsulation layer and the boundary of the base substrate in the notch 20. In this way, it is able to prevent the occurrence of any crack for the inorganic encapsulation layer near the cutting line during the cutting.

As shown in FIG. 13, in some embodiments of the present disclosure, the display substrate further includes a dam structure Dam arranged in the peripheral region 2 and at least partially surrounding the display region. In the notch 20, an orthogonal projection of the dam structure Dam onto the base substrate is spaced apart from the boundary 60 of the base substrate by a minimum third distance d. In the region 21 other than the notch 20 in the peripheral region 2, the orthogonal projection of the dam structure Dam onto the base substrate is spaced apart from the boundary 60 of the base substrate by a minimum fourth distance c. The third distance d is greater than the fourth distance c.

Illustratively, the dam structure Dam includes a first dam and a second dam, and the first dam is arranged between the display region and the second dam. The first dam at least partially surrounds the display region, and the second dam at least partially surrounds the display region. The first dam and the second dam are configured to limit the boundary of the organic encapsulation layer, so as to prevent the organic encapsulation layer from flowing to an edge of the display substrate during the formation thereof.

Illustratively, in the notch 20, an orthogonal projection of the second dam onto the base substrate is spaced apart from the boundary of the base substrate by the minimum third distance. In the region other than the notch 20 in the peripheral region 2, the orthogonal projection of the second dam onto the base substrate is spaced apart from the boundary of the base substrate by the minimum fourth distance.

In the embodiments of the present disclosure, when the third distance is greater than the fourth distance, a part of the inorganic encapsulation layer close to the boundary of the base substrate has a small thickness in the notch 20. In this way, it is able to prevent the occurrence of any crack for the inorganic encapsulation layer near the cutting line during the cutting.

The present disclosure further provides in some embodiments a display device, which includes the above-mentioned display substrate.

It should be appreciated that, the display device may be any product or member having a display function, such as a television, a display, a digital photo frame, a mobile phone, or a tablet computer. The display device further includes a flexible circuit board, a printed circuit board, and a back plate.

In the embodiments of the present disclosure, the compensation scanning member is arranged in the notch, and the first scanning member in the first display region is coupled to the second scanning member in the second display region through the compensation scanning member, so that the loading of the scanning line including the compensation scanning member, the first scanning member and the second scanning member is consistent with the loading of the scanning line in the third display region, i.e., the loading of the scanning line in the first display region and the second display region is consistent with the loading of the scanning line in the third display region. Hence, in the presence of the notch, it is able to ensure the loading uniformity of the scanning lines for transmitting the same signal in the display region, thereby to ensure the display quality of the display substrate.

Furthermore, the orthogonal projection of the compensation scanning member onto the base substrate at least partially overlaps with the orthogonal projection of the peripheral power line onto the base substrate, so the compensation scanning member does not occupy any additional space in the peripheral region. As a result, it is able to prevent a width of a bezel of the display substrate from being increased due to the compensation scanning member, thereby to provide the display substrate with a narrow bezel.

When the display device includes the above-mentioned display substrate, it also has the above-mentioned beneficial effects, which will not be particularly defined herein.

It should be appreciated that, when a signal line extends along a direction X, it means that a primary portion of the signal line, e.g., a line, a segment or a strip-like body, extends along the direction X, and an extension length of the primary portion is greater than an extension length of a secondary portion of the signal line, which is coupled to the primary portion, in the other direction.

It should be appreciated that, the expression "at a same layer" refers to that the film layers are arranged on a same structural layer. Alternatively, for example, the film layers on a same layer may be layer structures formed through forming thin layers for forming specific patterns through a single-film-forming process and then patterning the film layers with a same mask through a single patterning process. Depending on different specific patterns, a single patterning process may include multiple exposing, development or etching processes, and the specific patterns in the layer structure may be continuous or discontinuous. These specific patterns may also be arranged at different levels or have different thicknesses.

In the embodiments of the present disclosure, the order of the steps is not limited to the serial numbers thereof. For a person skilled in the art, any change in the order of the steps shall also fall within the scope of the present disclosure if without any creative effort.

It should be further appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a base substrate, and a display region and a peripheral region arranged on the base substrate, the display region comprising a first display region and a second display region arranged opposite to the first display region, the peripheral region comprising a notch, and at least a part of the notch being arranged between the first display region and the second display region, wherein the display substrate further comprises:

a scanning line comprising a first scanning member, a second scanning member and a compensation scanning member, the first scanning member being arranged in the first display region, the second scanning member being arranged in the second display region, at least a part of the compensation scanning member being arranged in the notch, the compensation scanning member being coupled to the first scanning member and the second scanning member;

a peripheral power line arranged in the peripheral region; and an inorganic encapsulation layer, wherein an orthogonal projection of the compensation scanning member onto the base substrate at least partially overlaps with an orthogonal projection of the peripheral power line onto the base substrate, and wherein a minimum distance between an orthogonal projection of the inorganic encapsulation layer in the notch onto the base substrate and a boundary of the base substrate in the notch is b; a minimum distance between the orthogonal projection of the inorganic encapsulation layer in a region other than the notch in the peripheral region onto the base substrate and the boundary of the base substrate in a region other than the notch in the peripheral region is a; and the minimum distance b is greater than the minimum distance a.

2. The display substrate according to claim 1, wherein the display region comprises a plurality of sub-pixels, each sub-pixel comprises a sub-pixel driving circuitry and a light-emitting element coupled to each other, the sub-pixel driving circuitry comprises a driving transistor and a compensation transistor, a first electrode of the compensation transistor is coupled to a second electrode of the driving transistor, and a second electrode of the compensation transistor is coupled to a gate electrode of the driving transistor; and the scanning line comprises a gate line coupled to a gate electrode of the compensation transistor in a corresponding sub-pixel driving circuitry.

3. The display substrate according to claim 2, wherein the sub-pixel driving circuitry comprises a resetting transistor, a first electrode of the resetting transistor is coupled to an initialization signal input end, and a second electrode of the resetting transistor is coupled to the gate electrode of the driving transistor; and the scanning line further comprises a resetting signal line coupled to a gate electrode of the resetting transistor in a corresponding sub-pixel driving circuitry.

4. The display substrate according to claim 2, wherein the sub-pixel driving circuitry further comprises a light-emission control transistor, a first electrode of the light-emission control transistor is coupled to the second electrode of the driving transistor, and a second electrode of the light-emission control transistor is coupled to a corresponding light-emitting element; and the scanning line further comprises a light-emission control signal line coupled to a gate electrode of the light-emission control transistor in a corresponding sub-pixel driving circuitry.

5. The display substrate according to claim 1, wherein the compensation scanning member is arranged at a same layer as the first scanning member and the second scanning member, or at a layer different from the first scanning member and the second scanning member.

6. The display substrate according to claim 5, wherein the compensation scanning member is coupled to the first scanning member and the second scanning member through a conductive connection member;

the display substrate further comprises an electrostatic discharge circuitry, and at least a part of the electrostatic discharge circuitry is arranged in the notch; and the electrostatic discharge circuitry comprises a high-level signal line and a low-level signal line, and an orthogonal projection of the conductive connection member onto the base substrate at least partially overlaps with an orthogonal projection of the high-level signal line onto the base substrate and an orthogonal projection of the low-level signal line onto the base substrate.

7. The display substrate according to claim 1, further comprising a first partial gate driving circuitry and a second partial gate driving circuitry arranged in the peripheral region, wherein the notch is arranged between the first partial gate driving circuitry and the second partial gate driving circuitry,
wherein the display substrate further comprises a gate driving signal line, the gate driving signal line comprises a first gate driving member, a second gate driving member and a compensation driving member, the first gate driving member is coupled to the first partial gate driving circuitry, the second gate driving member is coupled to the second partial gate driving circuitry, and the compensation driving member is coupled to the first gate driving member and the second gate driving member.

8. The display substrate according to claim 7, wherein at least a part of the compensation driving member is arranged in the notch, and an orthogonal projection of the compensation driving member onto the base substrate at least partially overlaps with the orthogonal projection of the peripheral power line onto the base substrate.

9. The display substrate according to claim 8, wherein the orthogonal projection of the compensation scanning member onto the base substrate is arranged between the display region and the orthogonal projection of the compensation driving member onto the base substrate.

10. The display substrate according to claim 7, wherein the gate driving signal line comprises a positive phase clock signal line and a negative phase clock signal line.

11. The display substrate according to claim 10, wherein an orthogonal projection of a compensation driving member of the negative phase clock signal line onto the base substrate is arranged between the display region and an orthogonal projection of a compensation driving member of the positive phase clock signal line onto the base substrate.

12. The display substrate according to claim 7, wherein the compensation driving member is arranged at a same layer as the compensation scanning member; or the compensation driving member is arranged at a layer different from the compensation scanning member.

13. The display substrate according to claim 1, further comprising a dam structure arranged in the peripheral region and at least partially surrounding the display region, wherein a minimum distance between an orthogonal projection of the dam structure in the notch onto the base substrate and a boundary of the base substrate in the notch is d;

a minimum distance between the orthogonal projection of the dam structure in a region other than the notch in the peripheral region onto the base substrate and the boundary of the base substrate in a region other than the notch in the peripheral region is c; and
the minimum distance d is greater than the minimum distance c.

14. A display device, comprising the display substrate according to claim 1.

15. The display substrate according to claim 3, wherein the sub-pixel driving circuitry further comprises a light-emission control transistor, a first electrode of the light-emission control transistor is coupled to the second electrode of the driving transistor, and a second electrode of the light-emission control transistor is coupled to a corresponding light-emitting element; and
the scanning line further comprises a light-emission control signal line coupled to a gate electrode of the light-emission control transistor in a corresponding sub-pixel driving circuitry.

16. The display substrate according to claim 8, wherein the gate driving signal line comprises a positive phase clock signal line and a negative phase clock signal line.

17. The display substrate according to claim 9, wherein the gate driving signal line comprises a positive phase clock signal line and a negative phase clock signal line.

18. The display device according to claim 14, wherein the display region comprises a plurality of sub-pixels, each sub-pixel comprises a sub-pixel driving circuitry and a light-emitting element coupled to each other, the sub-pixel driving circuitry comprises a driving transistor and a compensation transistor, a first electrode of the compensation transistor is coupled to a second electrode of the driving transistor, and a second electrode of the compensation transistor is coupled to a gate electrode of the driving transistor; and
the scanning line comprises a gate line coupled to a gate electrode of the compensation transistor in a corresponding sub-pixel driving circuitry.

19. The display device according to claim 18, wherein the sub-pixel driving circuitry comprises a resetting transistor, a first electrode of the resetting transistor is coupled to an initialization signal input end, and a second electrode of the resetting transistor is coupled to the gate electrode of the driving transistor; and
the scanning line further comprises a resetting signal line coupled to a gate electrode of the resetting transistor in a corresponding sub-pixel driving circuitry.

* * * * *